United States Patent
Siess

[11] Patent Number: 5,858,476
[45] Date of Patent: Jan. 12, 1999

[54] METHOD AND APPARATUS FOR MAKING AND DEPOSITING COMPOUNDS

[76] Inventor: Harold E. Siess, 8629 Welbeck Way, Gaithersburg, Md. 20879

[21] Appl. No.: 452,486

[22] Filed: May 30, 1995

Related U.S. Application Data

[63] Continuation-in-part of Ser. No. 179,710, Jan. 11, 1994, Pat. No. 5,420,437.

[51] Int. Cl.$^6$ .............................. C23C 16/00; H05H 1/00; H05H 1/24
[52] U.S. Cl. ......................... 427/561; 427/568; 427/569; 427/576; 427/579; 427/248.1; 427/255.1; 427/255.3; 427/562; 427/563; 427/564
[58] Field of Search .................................. 427/523, 529, 427/530, 531, 561, 562, 563, 564, 568, 569, 570, 581, 248.1, 255.3, 579, 574, 576, 255.1; 250/492.1, 492.2, 492.3

[56] References Cited

U.S. PATENT DOCUMENTS

| | | | |
|---|---|---|---|
| 3,977,090 | 8/1976 | Sowards | 34/9 |
| 4,318,208 | 3/1982 | Högberg | 23/230 R |
| 4,328,646 | 5/1982 | Kaganowicz | 427/579 |
| 4,342,617 | 8/1982 | Fu et al. | 427/579 |
| 4,394,401 | 7/1983 | Shioya et al. | 427/579 |
| 4,522,674 | 6/1985 | Ninomiya et al. | 427/596 |
| 4,526,805 | 7/1985 | Yoshizawa | 427/561 |
| 4,714,628 | 12/1987 | Eloy | 427/585 |
| 4,729,821 | 3/1988 | Timmons et al. | 204/164 |
| 4,892,751 | 1/1990 | Miyake et al. | 427/586 |
| 4,970,196 | 11/1990 | Kim et al. | 427/586 |
| 5,065,697 | 11/1991 | Yoshida et al. | 427/596 |
| 5,118,485 | 6/1992 | Arvidson et al. | 427/248.1 |
| 5,366,764 | 11/1994 | Sunthankar | 427/561 |
| 5,542,373 | 8/1996 | Nishizawa et al. | 117/103 |

*Primary Examiner*—Marianne Padgett
*Attorney, Agent, or Firm*—William H. Holt

[57] ABSTRACT

Apparatus and methods for treatment of materials by producing gaseous product material in the form of high purity molecules including metal oxides, metal carbides, etc., using catalytic and non-catalytic processes, and stoichiometrically depositing the gaseous product material on articles, substrates or base materials in the fields of semi-conductors, superconductors, thin optical films, wear and corrosion and the like. The deposition of high purity gas phase material produced by the disclosed methods are useful in forming common refractory layers, films, and bodies such as ferroelectric, superconducting and semiconductor materials, to name a few. Catalytic reaction for the formation and desorption of the molecules, etc., may be monitored by the use of work function measurements. Such measurements also provide a basis for detecting the presence of impurities, gasification of the surface catalyst, and conditions which favor maximum gas phase molecular formation. Catalytic surfaces are purified and cleaned with purification processes including selective gasification and desorption of impurities therefrom.

26 Claims, 1 Drawing Sheet

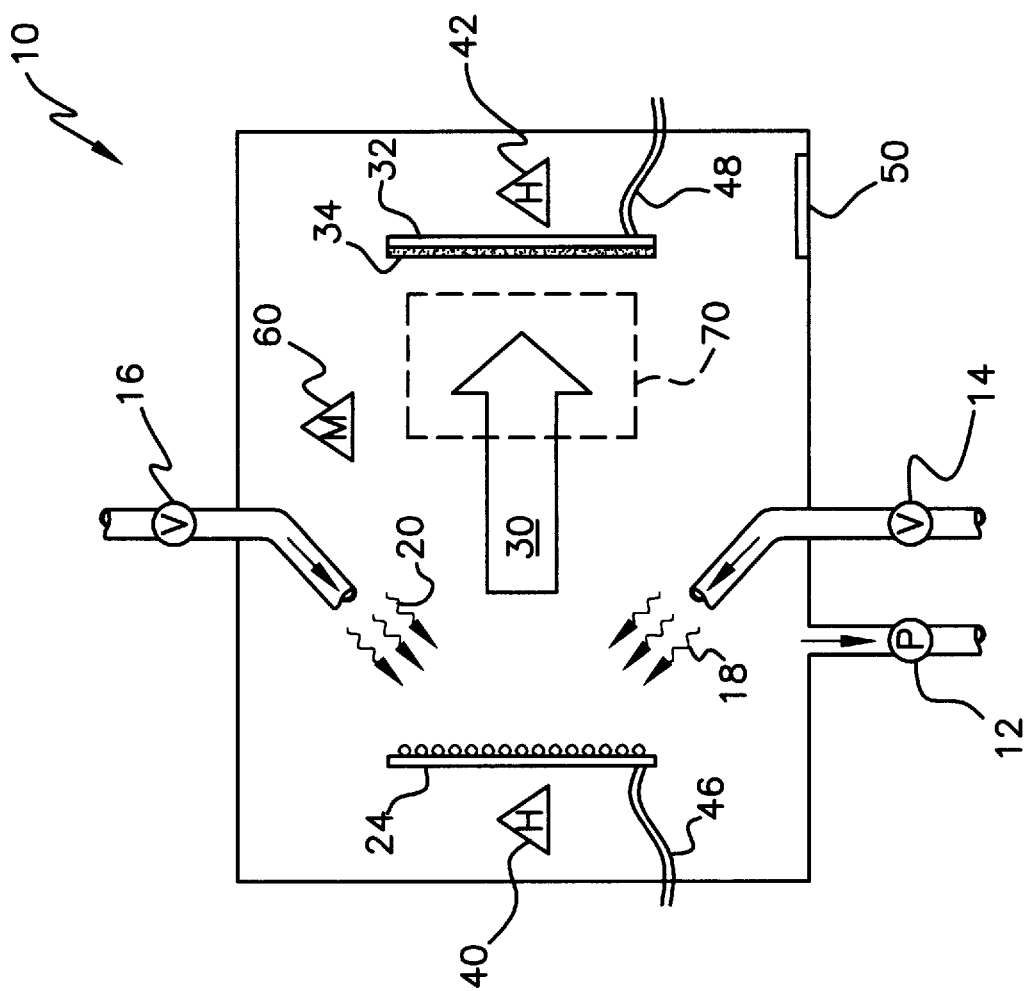

METHOD AND APPARATUS FOR MAKING AND DEPOSITING COMPOUNDS

CROSS-REFERENCE TO RELATED APPLICATION

This is a continuation-in-part of U.S. application Ser. No. 08/179,710 filed on Jan. 11, 1994 and now U.S. Pat. 5,420,437 granted on May 30, 1995.

The present invention relates to methods and apparatus for the deposition of compounds and, more particularly, to the use of surface reactions for the formation of molecular species in the gas phase.

BACKGROUND OF THE INVENTION

Evaporative Deposition of Compounds

Evaporation processes for the deposition of compounds can be divided into two types:
1. Direct Evaporation in which the evaporant is the compound itself; and
2. Reactive Evaporation and Activated Reactive Evaporation (ARE), in which the evaporant is a metal or a low-valence compound.

Direct Evaporation Processes

As a general case, when a common refractory compound is evaporated or sputtered the material is not transformed to the vapor state as compound molecules but as fragments of molecules. Many compounds including common refractory compounds, having this property, are said to vaporize incongruently. In the deposition of such vapors the fragments have to recombine, most probably on the substrate, to reconstitute the compound. This often leads to the deposition of sub-stoichiometric films.

Reactive Evaporation Processes

In reactive evaporation, in which a metal is evaporated in the presence of a reactive gas, a compound is formed by reaction of the evaporated metal species with molecules of the reactive gas. Though this technique has been extensively used to deposit a variety of films, it is generally observed that such films are sub-stoichiometric. It is also observed in some cases, especially in the synthesis of carbide films, that the deposition rate becomes a limiting factor governing the growth of the films. This limitation of deposition rate in the case of the reactive evaporation process is due to the reaction kinetics of the compound formation by this process. The presence of a "plasma" in the process of activated reactive evaporation, ARE, influences the reaction kinetics by providing the activation energy to the reactive species thereby synthesizing compounds films at considerably higher rates and lower temperatures.

Current Methods in Chemical Vapor Deposition

Chemical vapor deposition (CVD) is a process in which a surface is coated with vapors of volatile stable chemical compounds at a temperature below the melting point of the surface. One advantage of the process is the deposition of coatings varying in thickness, while main disadvantages are the necessity of heating the surface to be coated and the possibility of reactant-substrate interactions. In most cases, CVD reactions are activated thermally by use of a high substrate temperature. Another means of activation is obtained by electric-discharge plasma, i.e., plasma-assisted chemical vapor deposition (PACVD).

Problems Associated with the Use of Plasmas in Deposition Processes

In plasma-assisted processes, the plasma contains mixed reaction products including neutral particles, positive and negative ions, and electrons which may have adverse effects on the deposited material such as preferential sputtering. Any impurities carried into the plasma, from the constructional components of the plasma source, may be transferred to the deposited material. The introduction of such impurities creates problems, for example, in semiconductor device manufacturing and in the production of optical films. In addition the films deposited by ARE or PACVD are generally more complex than their analogues deposited by normal reactive evaporation or CVD.

Monitoring of a Surface Reaction by Work Function Measurements

The work function is a measure of the chemical potential and is a fundamental parameter of solid surfaces. Any changes in the surface state, such as chemical composition or geometric reconstruction, can be very precisely monitored through work function measurements. Thus far, no application of such a monitoring process has been used for the formation of molecules useful in deposition processes.

SUMMARY OF THE INVENTION

In accordance with the present invention it is proposed to lower the activation energy for associative reactions by the use of monitored and controlled catalytic processes on clean surfaces for the formation of high purity gaseous product materials which are useful for forming, e.g., stoichiometric common refractory materials useful for the treatment of materials. Some examples of such uses being the formation and deposition of metal oxide and metal carbide molecules in the fields of semiconductors, superconductors, thin optical films, wear and corrosion. The gaseous product material, i.e., the molecules, can be used in the form of neutrals and can also be ionized, if desired, prior to deposition.

The catalytic reaction for the formation and desorption of gaseous product material can be monitored by the use of work function measurements. The use of the present invention for monitoring such a reaction by measuring the work function provides a basis for detecting the presence of impurities, gasification of the surface catalyst, and conditions that favor maximum gas phase molecular formation to name a few.

Clean catalytic surfaces are provided by using purification processes including selective gasification of impurities from the catalytic surface and a determination of the impurities present.

BRIEF DESCRIPTION OF THE DRAWING

The single drawing is a schematic rendition of apparatus for making and depositing compounds.

DESCRIPTION OF THE PREFERRED EMBODIMENT

The invention relates to new and novel methods and apparatus for the formation of gaseous product material useful in deposition processes. The methods can be divided into two types: (I) the catalytic production of molecular species in deposition processes; and (II) production of molecular species by a noncatalytic process wherein a gas phase metal is reacted with a surface for forming a volatile product for use in deposition processes.

I. Surface Catalysis for the Formation of Molecules Useful in the Deposition of Materials The use of surface catalysis for the formation of molecular species useful in the deposition of common refractory compounds has several advantages over existing direct evaporation, reactive evaporation, ARE, CVD and PACVD methods including: the formation of gaseous product material not obtainable by other methods; and the deposition of such materials at low temperatures. In addition, the desorption process, may be accompanied by the formation of gas phase atomic or molecular radicals. The presence of such radicals in the gas phase ensures the deposition of stoichiometric films. Surface catalysis is useful in the deposition of ferroelectric materials, superconducting oxides, semiconductor materials, materials that are essentially transparent in at least some part of the spectrum, materials having a hardness in the range of six to ten on the Moh scale, and materials that have a melting point greater than 1000° Kelvin (K.). This deposition process allows for the deposition of common refractory materials on surfaces including semiconductors, articles which are to be subject to contact with another article after assembly for purposes of increasing the wear resistance of that article such as machine tools, articles which are subject to a heat in excess of 500° K. for purposes of increasing the heat resistance of the article such as in the leading edge of a turbine blade, and optical devices. Surface catalysis allows for the deposition of common refractory material in the form of corrosion and wear resistant coatings, superconducting oxide layers, optical films, thermal insulating layers, electrical insulating layers, buffer layers for superconducting oxide films, and semiconducting thin films to name a few.

Kinetic Model for the Formation and Desorption of Molecules by Surface Catalysis A. Molecular Desorption due to Reaction of An Adsorbed Metal Atom and An Adsorbed Reactant Atom The principal assumptions in the case of molecular formation between an adsorbed metal atom and an dissociatively adsorbed reactant and its rate of desorption per unit of surface area are:

1. The temperature is high enough and/or the pressure is low enough that no new phases are formed.
2. The incident metal atoms are adsorbed with unit efficiency.
3. The incident reactant gas is adsorbed dissociatively without an energy of activation to form mobile atoms.
4. The surface concentration of the intermediate reactants is negligible compared to the adsorbed reactant and metal atoms.
5. The reaction products-molecules are formed uniquely by surface reactions, i.e., no direct reaction occurs between the gas phase reactants and the adsorbed atoms.
6. The reaction products desorb with activation energies equal to their heats of adsorption, i.e., adsorption of reaction products would be nonactivated.

This leads to the following equations:

Rate of Adsorption of Reactant $$Z_{A2(ads)} = \frac{P_A}{\sqrt{2\pi M_{A2} k T_g}} (b_n) \qquad (1)$$

The first factor is simply the Hertz-Knudsen relation giving the number of collisions per unit surface area per second under a pressure $P_A$ at a gas temperature $T_g$, and second factor b(n) is the probability of adsorption during a given collision (the sticking coefficient).

Rate of Adsorption of Metal Atoms $$Z_{M(ads)} = \frac{P_M}{\sqrt{2\pi M k T_g}} \qquad (2)$$

Where b(n) is equal to 1, in accordance with assumption 1, above.

Rate of Desorption of the Products $$Z_{MxAy} = v_{MxAy} \theta^x \theta^y \exp\left[-\frac{y\lambda(\theta_A, \theta_M) + x\chi(\theta_M, \theta_A) - D_{MxAy}}{RT}\right] \qquad (3)$$

Where $v_{MxAy}$ is the preexponential factor, $\lambda(\theta_A, \theta_M)$ the binding energy of the reactant adsorbed at a surface coverage $\theta$, $\chi(\theta_M, \theta_A)$ the energy of desorption of the metal atom adsorbed at a surface coverage $\theta$, and $D_{MxAy}$ the energy of dissociation of the molecule MxAy into free atoms.

Along with the desorption of molecular species there is a probability that the adsorbed reactants, i.e., atomic species, will desorb from the surface. In general, conditions that lead to a high rate of molecular formation, excess A, result in conditions that favor the desorption of A relative to the metal (M). Therefore, $Z_{desA}$ is much greater than $Z_{desM}$. The rate of desorption of atomic species, A can be given as:

$$Z_{desA} \sim \exp(-\lambda(\theta_A)) \qquad (4)$$

This phenomena of gas phase radical formation in the desorption of molecular species is useful in assuring the deposition of stoichiometric films. An example, is the oxidation of aluminium on a rhenium catalyst followed by the deposition of the gaseous product material.

$$Al_{(g)} + O_{2(g)} \rightarrow AlO_{(g)} + O_{(g)} \qquad (5)$$

$$AlO_{(g)} + O_{(g)} \rightarrow Al_2O_{3(s)} \qquad (6)$$

It should be noted from the above equation that the rate of desorption is not a function of the vapor pressure of the molecules in their solid state, or that they have a stable solid state. Thus, with the present invention it is possible to desorb molecules from a catalytic surface at temperatures considerably lower than the temperature at which they would normally vaporize. It is therefore also possible to desorb molecular species such as $CeO_2$, $TiO_2$ and $ZrO_2$ by the oxidation of these metals on a rhenium, platinum or iridium surface at temperatures below 2300° K. and oxygen pressure at $10^{-5}$ torr. In addition to the low desorption temperature, the relative concentration of these dioxides in the gaseous product material is considerably greater than previously obtained from using vaporized material from their solid oxides. In addition, with the present invention it is possible to desorb CuOH from the reaction of copper and water on a metal surface, and $SiO_2$ from a platinum or iridium filament, foil or surface to name a few.

Though the above model is useful for determining what type of material agents will react to form products that desorb in a particular molecular form, there are cases wherein the assumptions 1–6 do not always hold true. For example, in the case of molecular oxide formation a new solid phase, oxide layer may form on the catalytic surface, and in the case of metal adsorption it can be adsorbed as an organometallic such that the sticking coefficient is not always equal to one.

B. Molecular Desorption due to Reaction of an Adsorbed Metal Atom and an Adsorbed Molecular Radical (e.g. CN, OH, $C_2$)

The principal assumptions in the case of molecular formation between an adsorbed metal atom and an adsorbed molecular radical and the rate of desorption per unit of surface area, are:

1. The same as previous assumptions 1, 2, 4, 5 and 6, and
7. The incident reactant gas is adsorbed dissociatively without an energy of activation to form mobile molecular radicals.

This leads to the following equation:

$$Z_{MxAy} = \nu_{MxAy} \theta^x \theta^y \exp\left[-\frac{y\lambda(\theta_A, \theta_M) + x\chi(\theta_M, \theta_A) - D_{MxAy}}{RT}\right] \quad (7)$$

Where $\nu_{MxAy}$ is the preexponential factor, $\lambda(\theta_A, \theta_M)$ is the binding energy of the reactant adsorbed at a surface coverage, $\chi(\theta_M, \theta_A)$ is the energy of desorption of the metal atom adsorbed at a surface coverage $\theta$, and $D_{MxAy}$ is the energy of dissociation of the molecule MxAy into free metal atoms and free radicals.

Examples of molecular radicals that can be formed on surfaces include OH from the dissociation of $H_2O$, $C_2$ from the dehydrogenation of hydrocarbons or from the dissociation of carbon 60 type molecules, and CN from the dissociation $C_2N_2$. It is thus possible to desorb dicarbides from the reaction of a hydrocarbon with a metal such as $CeC_2$, $ZrC_2$, $TiC_2$ and $UC_2$ on a rhenium surface, mono and dihydroxides of the rare earths and alkaline earths by the reaction of these metals with hydrogen and oxygen on a platinum group metal surface and the mono and dicyanides of the rare earths and alkaline earths by the reaction of these metals with CN to name a few.

The Nature of the Reactants

In accordance with the present invention an adsorbed metal atom will react with an adsorbed reactant; the metal can be introduced by vaporization of the metal, or it may be brought to the surface as an inorganic molecule or as an organometallic. The oxidation of organometallic molecules by catalytic methods provides for the deposition of oxide materials. It is preferred that, in the case of a catalytic reaction involving the desorption of a molecule containing metal, the catalytic surface should be chosen such that the surface is more electronegative than the reactant metal. Though the differences in electronegativities for such catalytic reactions are needed to ensure the desorption of species in molecular form the overriding determinant will be the bond energies as seen in Equation (3).

The above catalytic models use an adsorbed metal to react with an atomic or molecular radical for forming volatile molecular species useful in deposit. The process is also amenable to nonmetals as well. Examples are the oxidation of boron to form $BO_2$ molecules, the oxidation of phosphorous to form PO or $PO_2$, and as already noted the oxidation of Si to form $SiO_2$.

Conditions that Favor the Formation and Desorption of Molecules Produced by Surface Catalysis The reaction of two species on a surface takes place because of the differences in their electronegativities. It is well known that the energies associated with electronegativity differences can be used to account for the total bonding energy of the molecules formed. In fact, as can be seen from Equation (3), molecular desorption will occur at an efficient rate for a bi-molecular reaction when the bond energy of MA-λ is greater than 1. Therefore, in accordance with the present invention, M should be more electropositive than the material on which it is adsorbed, i.e. the surface catalyst. It is therefore desirable to use surfaces that have as high an electronegativity as possible under the condition that they do not gasify at the operational conditions under which the reaction takes place. Appropriate catalytic surfaces composed of metal would therefore be rhenium, tungsten, the platinum group metals, gold, silver, nickel and copper.

C. Molecular Desorption due to Reaction of Two or More Adsorbed Molecular Species It is known that acid-base reactions can be interpreted in terms of an oxide ion. For example, reactions such as the following take place in high temperature inorganic melts:

$$BaO + TiO_2 \rightarrow BaTiO_3 \quad (8)$$

In accordance with the present invention, the base (BaO) is an oxide donor and the acid ($TiO_2$) is an oxide acceptor. Such reactions are caused on surfaces with the desorption of the resulting "salt" ($BaTiO_3$). Such desorption processes are particularly useful in the deposition of mixed oxide films as buffer layers for superconducting oxides in the form of $LaAlO_4$ and ferroelectric materials in the form of $BaTiO_3$.

D. The Purification of Metals and the Formation of High Purity Metal Containing Compounds by Selective Desorption from a Catalytic Surface As can be seen from Equation (3), the probability of desorption of a metal is a function of the atomization energy of the formed molecule and the binding energy of the metal to the catalytic surface. Different metals have different binding energies for different contact surfaces and have different atomization energies. Therefore, different metals will have different probabilities of desorption. In accordance with the present invention, these differences in probabilities of desorption are used to separate metal species for purifying them, and for forming compound materials of high purity.

II. Non-Catalytic Surface Reactions for the Formation of Molecules Useful in the Deposition of Materials Acid-base type reactions given above in paragraph I.(C) may occur on a catalytic surface or by the introduction of a metal containing species onto another metal oxide with the desorption of the produced "salt". Another type of non-catalytic reaction of interest is the reaction of a metal impinging upon graphite. In many cases the metals react with solid graphite to form a volatile carbide species. As discussed above in Section I.(B), the present invention provides for forming volatile carbide species by catalytic methods, for example, by the reaction of methane and metal; however, this reaction produces hydrogen in the gas phase, which may or may not be desirable. The presence of hydrogen in the gas phase would have an undesirable effect if this mixture of carbide and hydrogen were to be introduced into a plasma for the purpose of forming carbide ions. In accordance with the present invention, it is preferred that volatile carbide species to be used in plasma assisted deposition processes be produced by the reaction of a metal species with graphite. This can be performed, for example, by the reaction of cerium on a contact surface of a reactor body formed of graphite, the product of which is cerium dicarbide, i.e., a volatile carbide.

III. Ionization of Gaseous Product Material for Use in Deposition Processes

It is provided for in this invention to ionize the gaseous product material prior to it being deposited. An ionizing operation can be performed through various methods, such as the use of ionizing particles, or a plasma, or a surface ion source. These methods provide for the gaseous product material to be deposited upon a substrate, or body being treated, for forming stoichiometric solids at low temperatures. The invention also provides for the formation of an ion beam from the ionized gaseous product material for the ion beam processing of materials.

IV. Purification of the Catalytic Surface and Methods for Determining the Presence of Impurities Thereon This invention provides a method for the purification of a metal and for determining the presence of impurities thereon. This method is particularly useful for removing transition metal impurities from thin foils or small diameter wires, which may be on the order of one millimeter thickness or less, made of noble metals, rhenium and tungsten. The method comprises heating a metal to a temperature below its melting point, and more particular in the cases of rhenium, iridium and tungsten between 1700° and 2800° K. in an atmosphere of either oxygen with at least one halogen or oxygen with hydrogen for gasifying transition metal impurities. The total atmospheric pressure is held at about $10^{-5}$ torr with a partial pressure of halogen or hydrogen of greater that $10^{-6}$ torr. The metal is held under these conditions until the metal is sufficiently pure for catalytic purposes. This invention also provides a method for the removal of electronegative gases such as oxygen and halogen and for the detection of these elements on the surfaces of metals.

The invention also comprises the steps of selecting gas phase metal atoms of the alkaline earths and rare earths, and impinging said gas phase metal atoms upon said metal surface for removing any adsorbed electronegative element from said metal in the form of molecular ions in the gas phase. The rate of gas phase metal impingement is such that a maximum of molecular ions are produced. Such molecular ions can then be detected for determining the purity of the metal.

DETAILED DESCRIPTION OF THE DRAWING

The drawing shows a vacuum chamber, generally indicated by the numeral 10, which may be evacuated by a pump 12 down to a pressure of $10^{-10}$ torr, or less. A pair of valves 14 and 16, which may be leak valves, are provided for introducing gas phase material as is indicated by the wavy arrows 18 and 20. The gas phase material impinges upon a contact surface 24, which may be in the form of a coil, foil, or flat plate, etc., so that the gas phase material adsorbs thereon at less than one mono-layer 26. The gas phase material is desorbed in the form of gaseous product material indicated by the large arrow 30 and containing molecules and atomic species.

The gaseous product material 30 is deposited upon a substrate 32 in the form of layers, coatings, implants, and the like, indicated by the numeral 34. Contact surface 24 and substrate 32 are provided with similar heat sources 40 and 42, which may be, for example, a rf-coil, electron gun, resistance heater and the like, for heating the contact surface 24 and substrate 32 to temperatures between 500° K. and 2800° K. These temperatures can be monitored by thermocouples 46 and 48 and an optical pyrometer 50.

The chamber 10 may also contain an electron meter, or detecting device, 60 for use in measuring the work function of contact surface 24.

The gaseous product material 30 can be passed through an ionizer 70, which ionizer is used for providing ionizing particles, or an ion beam, or a plasma, or a surface ion source for ionizing at least part of the gaseous product material 30.

The foregoing description is directed to preferred embodiments of the present invention and to the presently contemplated best mode of apparatus and process steps for performing the invention. It is, of course, understood that various modifications and changes may be made without departing from the spirit and scope of the invention which are to be determined in accordance with the following claimed subject matter.

I claim:

1. A deposition process for depositing materials upon a substrate, said process comprising steps of providing a catalytic surface ion source; heating said surface ion source; selecting gas phase material; impinging said gas phase material upon said surface ion source to absorb and ionize at least some of said gas phase material thereon; catalytically reacting said gas phase material on said catalytic surface ion source to form products; desorbing said products in gaseous form from said catalytic surface ion source to form gaseous product material at least some of which are molecules and ions; and depositing said molecules and said ions upon said substrate.

2. A deposition process as defined in claim 1 wherein said gaseous product material forms compound molecules selected from the group consisting of carbides, nitrides, silicides, borides, fluorides and oxides.

3. A deposition process to deposit compounds by catalytic deposition upon a substrate, said process comprising steps of: providing a catalytic surface, heating said catalytic surface; selecting gas phase material and impinging said gas phase material upon said catalytic surface to create adsorbed materials from some of said gas phase material; catalytically reacting said adsorbed materials on said catalytic surface to form products therefrom at least some of said products being compound molecules; desorbing at least some of said products including at least some of said compound molecules from said catalytic surface to form gaseous product material which is essentially free of any matter which forms said catalytic surface; and depositing said gaseous compound molecules upon said substrate to form thereon a solid compound which consists of the same chemical elements as in said compound molecules.

4. A deposition process as defined in claim 3 further including a step of selecting said gas phase material to contain oxygen and an organometallic for to form said compound molecules which are metal oxides.

5. A deposition process as defined in claim 3 wherein said gaseous product material is selected from the group consisting of carbides, nitrides, silicides, borides, fluorides and oxides.

6. A deposition process as defined in claim 3 further including the step of ionizing said gaseous product material to form ions from at least part of said gaseous product material.

7. A deposition process as defined in claim 6 wherein the step of ionizing said gaseous product material comprises a step of bombarding said gaseous product material with ionizing particles to form ions therefrom.

8. A deposition process as defined in claim 3 further including the step of selecting said gas phase material to contain silicon and oxygen to form said solid compound as $SiO_2$.

9. A deposition process as defined in claim 3 further including the step of selecting said gas phase material to include at least one metal.

10. A deposition process as defined in claim 3 further including the step of selecting said catalytic surface from the group consisting of rhenium, tungsten, the platinum group metals, gold, silver and alloys thereof.

11. A deposition process as defined in claim 3 further including the step of selecting said gas phase material to produce said gaseous product material to form said solid compound as a refractory compound.

12. A deposition process as defined in claim 11 wherein said refractory compound is a ferroelectric material.

13. A deposition process as defined in claim 11 wherein said refractory compound has a melting point greater than 1,000° K.

14. A deposition process as defined in claim 3 further including the step of selecting said gas phase material to produce said gaseous product material to form said solid compound as a solid stoichiometric compound.

15. A deposition process as defined in claim 3 wherein said gaseous product material consists of inorganic molecules.

16. A deposition process as defined in claim 3 wherein said compound molecules do not have a stable solid state.

17. A deposition process as defined in claim 3 wherein the step of desorbing said compound molecules from said catalytic surface is performed at a temperature lower than that at which said compound molecules would vaporize from their corresponding solid state.

18. A deposition process as defined in claim 3 wherein said substrate is a semi-conductor and said solid compound is formed on said semi-conductor.

19. A deposition process as defined in claim 3 wherein said substrate is subject to wear and corrosion, and said solid compound protects said substrate from said wear and corrosion.

20. A deposition process as defined in claim 3 wherein said substrate is an optical device.

21. A deposition process as defined in claim 3 wherein said solid compound is a superconducting oxide layer.

22. A deposition process as defined in claim 3 wherein said solid compound is an electrical insulating layer.

23. A deposition process as defined in claim 3 wherein said solid compound is a buffer layer and said substrate is a superconducting oxide film.

24. A deposition process as defined in claim 3 wherein said solid compound is a semi-conducting film.

25. A deposition process to deposit compounds by catalytic deposition upon a substrate, said method comprising steps of: providing a catalytic surface, heating said catalytic surface; selecting gas phase material and impinging said gas phase material upon said catalytic surface to create adsorbed material from some of said gas phase material; reacting said adsorbed material on said surface to form products therefrom at least some of said products being compound molecules and radicals; desorbing at least some of said products including at least some of said compound molecules and at least some of said radicals from said catalytic surface to form gaseous product material essentially free of any matter which forms said catalytic surface; and impinging said gaseous product material upon said substrate to form a deposited compound thereon.

26. A deposition process to deposit compounds by catalytic deposition upon a substrate, said process comprising steps of: providing a catalytic surface, heating said catalytic surface; selecting gas phase material and impinging said gas phase material upon said catalytic surface to create adsorbed materials from some of said gas phase material; catalytically reacting said adsorbed materials on said catalytic surface to form products therefrom at least some of said products being compound molecules; desorbing at least some of said products including at least some of said compound molecules from said catalytic surface to form gaseous product material which is essentially free of any matter which forms said catalytic surface; and selecting said gas phase material to include hydrogen and oxygen to produce said gaseous product material as hydroxides to form a solid oxide.

* * * * *